United States Patent [19]

Ishihara et al.

[11] Patent Number: 4,908,696
[45] Date of Patent: Mar. 13, 1990

[54] CONNECTOR AND SEMICONDUCTOR DEVICE PACKAGES EMPLOYING THE SAME

[75] Inventors: Shousaku Ishihara, Chigasaki; Hitoshi Yokono, Fujisawa; Tsuyoshi Fujita, Yokohama; Ryohei Satoh, Yokohama; Kiyotaka Wasai, Yokohama, all of Japan

[73] Assignee: Hitachi, Ltd., Tokyo, Japan

[21] Appl. No.: 97,124

[22] Filed: Sep. 16, 1987

[30] Foreign Application Priority Data

Sep. 19, 1986 [JP] Japan .................. 61-219312

[51] Int. Cl.⁴ ............... H01L 39/02; H01L 23/02
[52] U.S. Cl. ............................. 357/81; 357/80; 357/28
[58] Field of Search .................. 357/80, 28, 81

[56] References Cited

U.S. PATENT DOCUMENTS

| | | | |
|---|---|---|---|
| 3,440,407 | 4/1969 | Goltsos et al. | 357/80 |
| 3,551,645 | 12/1970 | Stoll | 357/28 |
| 4,082,394 | 4/1978 | Gedney et al. | 357/80 |
| 4,257,061 | 3/1981 | Chapel, Jr. et al. | 357/28 |
| 4,374,316 | 2/1983 | Inamori et al. | 357/80 |
| 4,561,006 | 12/1985 | Currie | 357/28 |
| 4,667,219 | 5/1987 | Lee et al. | 357/80 |

FOREIGN PATENT DOCUMENTS 56-103458  8/1981  Japan ..................... 357/80

OTHER PUBLICATIONS

Burry et al., IBM Technical Disclosure Bulletin, vol. 19, No. 8, Jan. 1977, "Multidirectional Expansion Packaging".

Primary Examiner—Rolf Hille
Assistant Examiner—Hoanganh Le
Attorney, Agent, or Firm—Antonelli, Terry & Wands

[57] ABSTRACT

The present invention relates to a connector structure for soldering a wiring substrate such as a ceramic wiring substrate to a connector provided on a printed board and also pertains to semiconductor device packages using the same. It is an object of the present invention to provide a connector structure which provides highly reliable electrical connection, together with semiconductor device package using the same. The object is attained by soldering a ceramic wiring substrate to a connector which involves a heater.

18 Claims, 2 Drawing Sheets

CONNECTOR AND SEMICONDUCTOR DEVICE PACKAGES EMPLOYING THE SAME

BACKGROUND OF THE INVENTION

The present invention relates to a connector structure for soldering a wiring substrate such as a ceramic wiring substrate to a connector provided on a printed board. The present invention also pertains to semiconductor device packages employing said connector structure.

In electronic devices such as computers and communication devices, a ceramic wiring substrate having a semiconductor element mounted thereon is employed in such a manner that the substrate is connected to a connector provided on a printed board from the viewpoint of miniaturization and reliability. In this type of connecting method, a ceramic wiring substrate is provided with power supply pins and signal input/output pins and this substrate is connected to a connector provided on a printed board by inserting the pins into the connector as described in Japanese Utility Model Laid-Open No. 52082/1982.

However, the above-described prior art suffers from the following problems. Since the electrical connection between the ceramic wiring substrate and the connector is effected by means of the resilient force applied to the pins from the metallic material constituting the connector terminals, the state of contact changes with time, resulting in an increase in the contact resistance, and the prior art is also liable to a contact failure, which means that the reliability in terms of electrical connection is disadvantageously low.

SUMMARY OF THE INVENTION

It is a primary object of the present invention to provide a connector structure which provides highly reliable electrical connection, together with semiconductor device packages using the same.

The above-described object is attained by soldering a ceramic wiring substrate to a connector which involves a heater.

The connector is formed from any heat-resistant insulating material, and the heater is formed from any electrical conductor. A combination of a ceramic material and a metallic material is preferable. For example, it is preferable to employ a combination of an alumina or mullite ceramic material and tungsten or molybdenum.

The ceramic wiring substrate and the connector can be connected together and detached from each other by fusing solder by means of heat generated from the heater involved in the connector by supplying a current to the heater. In other words, the ceramic wiring substrate and the connector can be soldered to each other, and the electrical connection reliability is therefore increased.

Although the ceramic wiring substrate is connected to the connector provided on the printed board using solder, the substrate is readily detached from the connector because the connector involves a heater.

Consequently, maintenance of the wiring substrate is readily conducted even after it has been incorporated in an apparatus.

DETAILED DESCRIPTION OF THE PREFERRED EMBODIMENTS

Example 1

Figure 1:
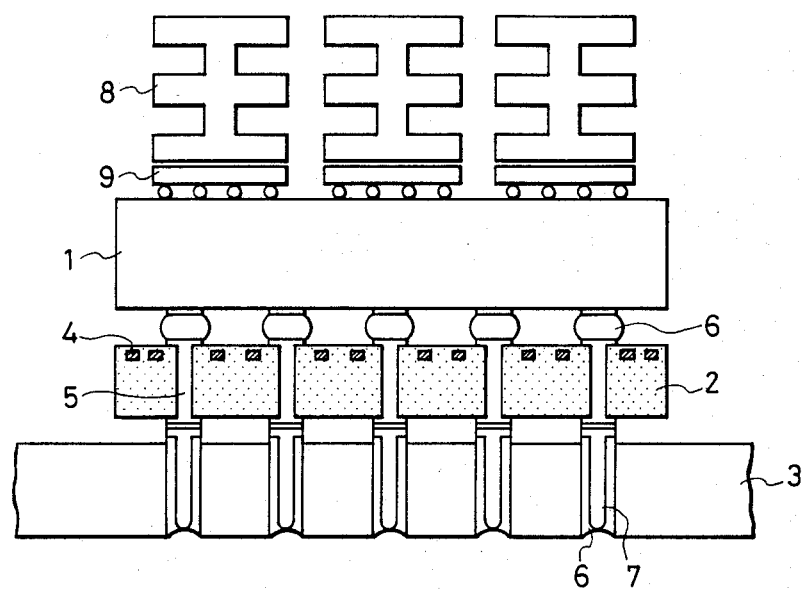
FIG. 1 is a sectional view showing a semiconductor device package having a connector according to Example 1 of the present invention.

The following is a description of an example wherein an alumina connector 2 which involves a tungsten heater is produced by the green sheet laminating method. The process for producing the connector 2 will first be explained.

Ninety percent by weight of alumina having a particle diameter several $\mu$m or less is mixed with 10% by weight of a cordierite composition fine powder as a firing assistant to prepare a ceramic powder. With respect to 100 g of the above-described ceramic powder, 8 g of polyvinyl butyral as an organic binder and 45 g of azeotrope as a solvent which consists essentially of trichloroethylene, tetrachloroethylene and butyl alcohol are added thereto and thoroughly mixed together in a ball mill to prepare a slurry in which the ceramic powder is uniformly dispersed. Subsequently, the slurry is degased under low pressure while being stirred, thereby removing air bubbles from the slurry. Thereafter, the slurry is sliced into green sheets each having a thickness of 0.25 mm by the use of a doctor blade type casting machine. Each of the green sheets thus produced is cut into a sheet 20 cm square. Then, through-holes for connection between the upper and lower wirings are formed in each of the cut green sheets by the use of a punching die having tungsten carbide pins.

The process for producing tungsten paste used as wiring and heater materials will next be described.

Eighty grams of a tungsten powder having an average particle diameter of 1.5 $\mu$m, 3 g of ethyl cellulose as an organic binder, and 17 g of diethylene glycol as an organic solvent are mixed together and kneaded using a kneading machine or a kneading roller. Thereafter, butyl carbitol acetate is added to the kneaded mixture so as to adjust the viscosity, thus preparing tungsten paste.

Subsequently, by the screen printing method, the through-holes in each green sheet are filled with the tungsten paste and a wiring pattern of tungsten paste is formed on the green sheet. In this way, each of the green sheets to be laminated is printed with predetermined obverse-, reverse-and inner-side wiring patterns, together with a heater pattern which is isolated from these signal lines.

Then, the above-described sheets are stacked one upon another and laminated at 100° C. and 100 kg/cm². The green sheet laminate thus formed is then subjected to the firing step to become a connector 2. In this example, firing was carried out using a box type electric furnace employing molybdenum as a heater in a mixed gas atmosphere of nitrogen, hydrogen and water vapor, and the temperature was raised to 1,600° C.

Subsequently, the tungsten conductor portions on the obverse and reverse surfaces of the connector 2 finished with the firing step are coated with nickel and gold films having thicknesses of 4 $\mu$m and 0.2 $\mu$m, respectively, by means of electroless plating. Then, kovar pins 7 which are to be inserted into a printed board 3 are brazed to the connector 2 using silver solder at 800° C. in a mixed gas atmosphere of nitrogen and hydrogen.

Figure 2:
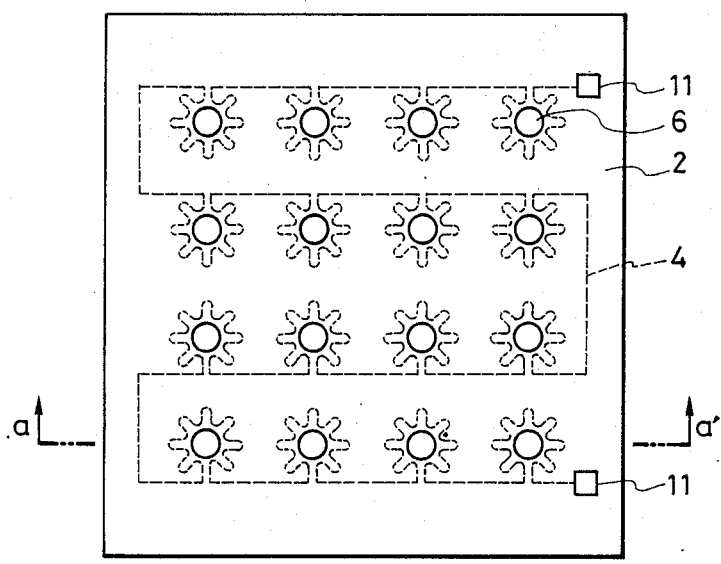
FIG. 2 is a plan view of the connector according to Example 1.

Further, a low-melting solder (melting point: 170° C.) for connecting a ceramic wiring substrate 1 is screen-printed on the upper surface of the connector 2 provided with the pins 7. Subsequently, the pins 7 of the connector 2 are inserted into the printed board 3 and bonded using a eutectic solder (melting point: 183° C.). On the other hand, a low-melting solder is put on portions of the ceramic wiring substrate 1 which are to be connected to the connector 2. Then, the ceramic wiring substrate 1 having LSIs 9 mounted thereon is placed on the connector 2, and a current is supplied to the heater energizing terminals of the connector 2 to effect soldering. Cooling fins 8 may be provided above the LSIs 9 as shown in FIG. 1. The reference numeral 5 in FIG. 1 denotes a conductor material. The cross-section of the semiconductor device package thus produced is shown in FIG. 1, and the plan view of the connector 2 is shown in FIG. 2. The chain line in FIG. 2 indicates the heater 4 involved in the connector 2. The solder 6 can be fused by supplying a current between the heater energizing terminals 11.

It should be noted that FIG. 1 is a sectional view taken along the line a—a' of FIG. 2.

Comparative Example

An example in which a connector made from polybutylene terephthalate and having phophor bronze pins is used will be described below.

The connector 2 is soldered to the printed board 3 and the ceramic wiring substrate 1 having kovar pins brazed thereto using silver solder is inserted into the connector 2 in the same manner as the above. The contact resistance at this time was 0.1 mΩ per pin on the average.

Subsequently, a thermal cycle test was carried out on the printed board 3 having the ceramic wiring substrate 1 connected thereto in each of the above-described Example and Comparative Example (conditions: −50° C. and 150° C.). The results of the test showed that, in the connecting method in accordance with Comparative Example, an average contact resistance after 500 cycles was 0.5 mΩ and 0.2% of the total number of pins had contact failures after 5,000 cycles, whereas, in Example 1 of the present invention, no contact failure occurred even after 5,000 cycles and the resistance at the junctions was almost 0 mΩ.

Example 2

The following is a description of an example in which the connector 2 and the printed board 3 are also soldered to each other using a heater 4 involved in the connector 2.

Figure 3:
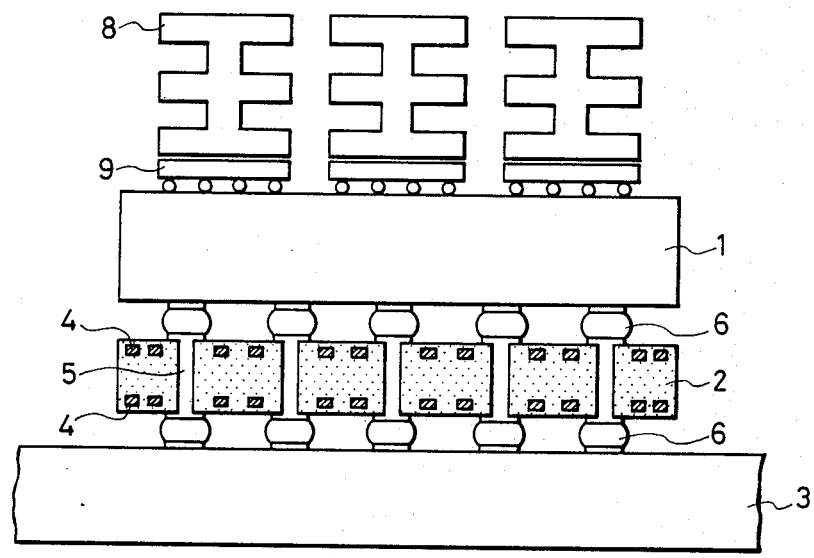
FIG. 3 is a sectional view showing a semiconductor device package having a connector according to Example 2 of the present invention.

The connector 2 was produced in the same way as in Example 1 except that heaters 4 were provided in both the obverse and reverse sides, respectively, of the connector 2. First, the connector 2 and the printed board 3 are soldered to each other by supplying a current to the reverse-side heater 4 in the same way as in Example 1, and the connector 2 and the ceramic wiring substrate 1 are then soldered together. The cross-section of the semiconductor device package produced in accordance with this Example is shown in FIG. 3.

In this Example also, no contact failure was found in the same thermal cycle test as in Example 1.

Example 3

This Example is the same as Example 2 except that a single heater 4 is provided in the central portion of the connector 2 and this heater 4 is supplied with a current to thereby solder the connector 2 to the printed board 3 and then solder the ceramic wiring substrate 1 to the connector 2. In this Example also, no contact failure was found in the same thermal cycle test as in Example 1.

Example 4

An example in which the principal component of the material for the connector 2 is changed from alumina to mullite will next be explained.

The connector 2 was produced in the same way as in Example 1 except that 70% by weight of mullite powder and 30% by weight of fine powder of cordierite and silica as a firing assistant were employed to prepare a ceramic powder. Then, the produced connector 2 was soldered to the printed board 3 and the ceramic wiring board 1 was subsequently soldered to the connector 2 by energizing the heater 4 involved in the connector 2 in the same manner as in Example 1. Thereafter, the same thermal cycle test as that in Example 1 was carried out. The results found no contact failure as in the case of Example 1.

Example 5

Two connectors were produced in the same way as in Example 1 but using two different kinds of material: an alumina material consisting essentially of 85 to 96% by weight of alumina having a particle diameter of several μm or less and 15 to 4% by weight of a cordierite composition fine powder; and a mullite material consisting essentially of 50 to 95% by weight of mullite powder and 50 to 5% by weight of a fine powder of cordierite and silica. In this Example also, no contact failure was found as in Example 1.

As has been described above, according to the present invention, the ceramic wiring substrate 1 and the connector 2 are soldered to each other and therefore the reliability in terms of electrical connection is improved.

Accordingly, the present invention enables an increase in the number of contacts per unit area as compared with the conventional mechanical connectors, advantageously.

What is claimed is:
1. A semiconductor device package comprising:
   a printed board;
   a connector having a first side closest to the printed board, the first side having a first surface, the connector being provided on said first surface with pins which are adapted to be inserted into said printed board;
   a wiring substrate soldered to a second side of said connector, the connector having conductive material elements extending therethrough from the first side to the second side, the connector having heater means provided around the conductive material elements extending through the connector;
   a semiconductor integrated circuit element mounted on said wiring substrate; and
   a cooling fin for cooling said semiconductor integrated circuit element, said cooling fin being in thermal connection with said semiconductor integrated circuit element.
2. A semiconductor device package according to claim 1, wherein said pins of said connector are inserted into said printed board.

3. A semiconductor device package according to claim 2, wherein said cooling fin is disposed on said semiconductor integrated circuit element.

4. A semiconductor device package according to claim 3, wherein said first side and said second side of the connector are opposite sides of the connector.

5. A semiconductor device package according to claim 1, wherein said cooling fin is disposed on said semiconductor integrated circuit element.

6. A semiconductor device package according to claim 1, wherein said heater means includes at least one heating element extending inside said connector and substantially surrounding each of the conductive material elements.

7. A semiconductor device package according to claim 6, wherein said heating element is a conductive metal wiring pattern positioned so as to substantially surround each of the conductive material elements.

8. A semiconductor device package according to claim 1, wherein said heater means includes a heating element positioned inside said connector.

9. A semiconductor device package according to claim 8, wherein said heating element positioned inside said connector is positioned adjacent the first side of the connector.

10. A semiconductor device package according to claim 8, wherein said connector has a central portion extending substantially midway between the first and second sides, and wherein the heating element is positioned to extend in said central portion.

11. A semiconductor device package according to claim 1, wherein said heater means includes two heating elements, respectively positioned adjacent the first and second sides of the connector.

12. A semiconductor device package according to claim 1, wherein said connector is made of a ceramic material and is in the form of a sheet, the heater means extending within the sheet.

13. A semiconductor device package according to claim 1, wherein said first side and said second side of the connector are opposite sides of the connector.

14. A semiconductor device package according to claim 1, wherein said heater means is a wiring pattern formed of tungsten.

15. A semiconductor device package comprising:
a printed board;
a connector having a first side closest to the printed board, the first side having a first surface, the connector being provided on said first surface with pads which are adapted to be soldered to said printed board, the connector having a second side with a second surface, and being provided on said second surface with other pads;
a wiring substrate soldered to said second side of said connector, the connector having conductive material elements extending therethrough from the first side to the second side, the connector having heater means provided around the conductive material elements extending through the connector;
a semiconductor integrated circuit element mounted on said wiring substrate; and
a cooling fin for cooling said semiconductor integrated circuit element, said cooling fin being in thermal connection with said semiconductor integrated circuit element.

16. A semiconductor device package according to claim 15, wherein said heater means includes at least one heating element extending inside said connector and substantially surrounding each of the conductive material elements.

17. A semiconductor device package according to claim 15, wherein said heater means includes two heating elements, respectively positioned adjacent the first and second sides of the connector.

18. A semiconductor device package according to claim 15, wherein said pads are soldered to said printed board.

* * * * *